(12) United States Patent
Cheung et al.

(10) Patent No.: US 9,261,550 B2
(45) Date of Patent: Feb. 16, 2016

(54) IN-SITU CABLE UNPLUG DETECTOR OPERATING DURING NORMAL SIGNALING MODE

(71) Applicant: Pericom Semiconductor Corporation, Milpitas, CA (US)

(72) Inventors: Hung-Yan Cheung, Hong Kong (HK); Michael Y. Zhang, Palo Alto, CA (US)

(73) Assignee: Pericom Semiconductor Corporation, Milpitas, CA (US)

( * ) Notice: Subject to any disclaimer, the term of this patent is extended or adjusted under 35 U.S.C. 154(b) by 95 days.

(21) Appl. No.: 14/307,340

(22) Filed: Jun. 17, 2014

(65) Prior Publication Data

US 2015/0002167 A1  Jan. 1, 2015

Related U.S. Application Data

(63) Continuation of application No. 13/218,419, filed on Aug. 25, 2011, now Pat. No. 8,786,291.

(51) Int. Cl.
*G01R 31/02* (2006.01)
*G01R 31/04* (2006.01)

(52) U.S. Cl.
CPC ............ *G01R 31/021* (2013.01); *G01R 31/026* (2013.01); *G01R 31/04* (2013.01)

(58) Field of Classification Search
CPC ..... G01R 31/021; G01R 31/04; G01R 13/385
USPC .................. 324/537, 539, 522, 555
See application file for complete search history.

(56) References Cited

U.S. PATENT DOCUMENTS

| | | |
|---|---|---|
| 6,154,447 A | 11/2000 | Vedder |
| 8,786,291 B2 | 7/2014 | Cheung et al. |
| 2009/0128161 A1 | 5/2009 | Xu et al. |
| 2011/0148470 A1* | 6/2011 | Inoue .................. G06F 13/4081 327/77 |
| 2013/0049765 A1 | 2/2013 | Cheung et al. |

OTHER PUBLICATIONS

U.S. Notice of Allowance dated Mar. 20, 2014 issued in U.S. Appl. No. 13/218,419 [PS-165].

* cited by examiner

*Primary Examiner* — Vincent Q Nguyen
(74) *Attorney, Agent, or Firm* — Weaver Austin Villeneuve & Sampson LLP

(57) ABSTRACT

An in-situ unplug detector circuit detects when a cable is disconnected or unplugged. Detection does not have to wait for normal signaling to pause, such at the end of a frame or timeout. Instead, detection occurs during normal signaling. When the cable is disconnected, the transmitter no longer drives the load at the far end of the cable, and thus can drive the near end to a higher high voltage and to a lower low voltage. The increased voltage swing is detected by a detector at the near end that amplifies the transmitter output to the cable. A fast detector has a higher bandwidth and faster response time than a slow detector, and generates a fast detect signal that crosses over a slow detect signal. When the cable is disconnected, the fast detect signal again crosses over the slow detect signal, and decision logic activates an unplug signal.

20 Claims, 7 Drawing Sheets

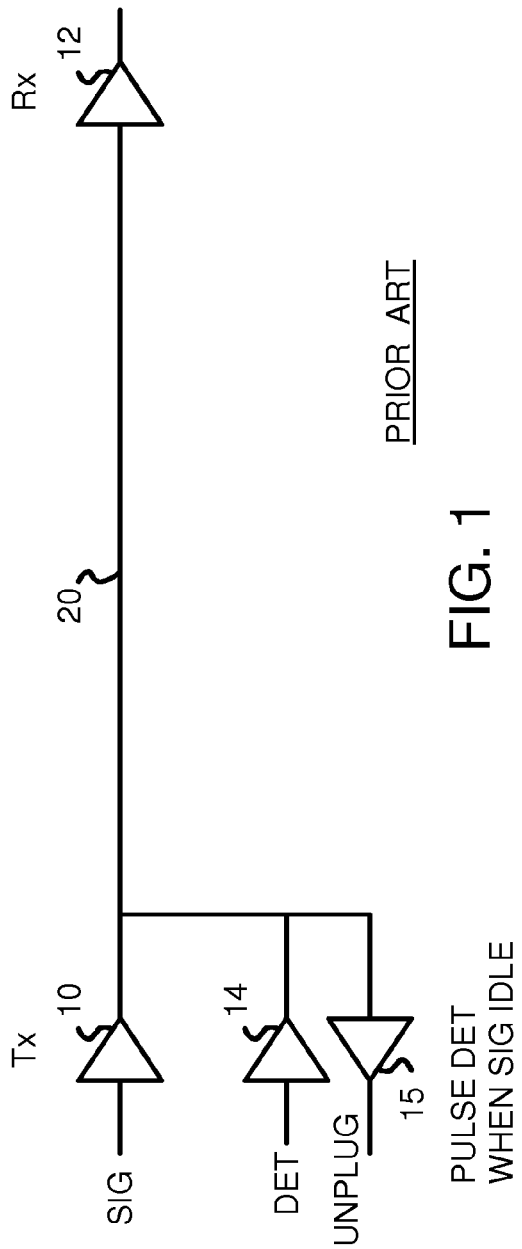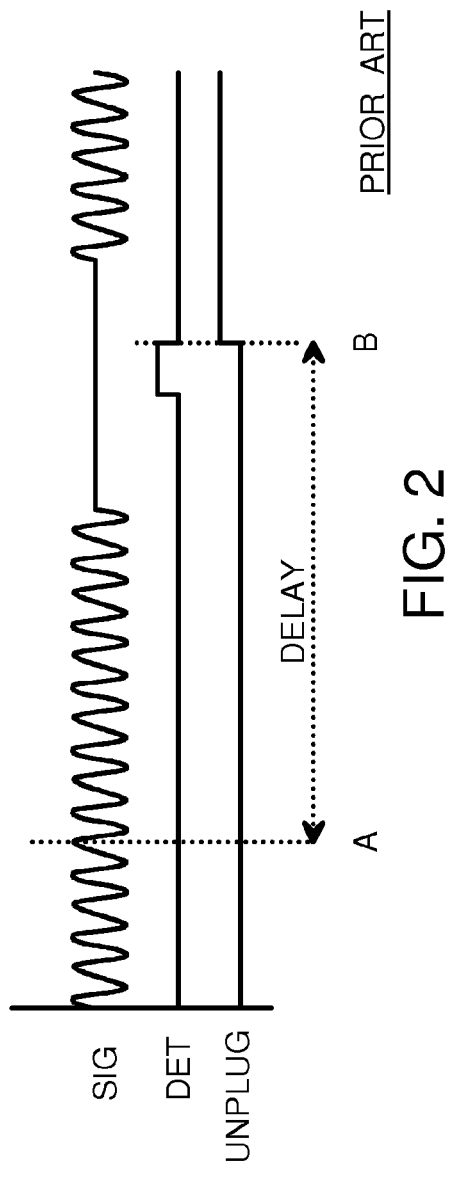

IN-SITU CABLE UNPLUG DETECTOR OPERATING DURING NORMAL SIGNALING MODE

RELATED APPLICATION DATA

The present application is a continuation of and claims priority under 35 U.S.C. 120 to U.S. patent application Ser. No. 13/218,419 entitled In-Situ Cable Unplug Detector Operating During Normal Signaling Mode filed on Aug. 25, 2011 now U.S. Pat. No. 8,786,291, the entire disclosure of which is incorporated herein by reference for all purposes.

FIELD OF THE INVENTION

This invention relates to cable disconnect detectors, and more particularly to a cable unplug detector that operates during signaling.

BACKGROUND OF THE INVENTION

Computer, communication, and other electronic systems are often expandable or networked through cables. The cables may be plugged into sockets or other connectors. Cables could carry electronic signals using a variety of protocols, such as Universal-Serial-Bus (USB), small-computer system interface (SCSI), Ethernet, Token Ring, Serial AT-Attachment (SATA), Peripheral Component Interconnect (PCI), PCI Express (PCIe), various differential signaling schemes, and other variations, whether standardized or proprietary.

Cables can sometimes become disconnected, such as when a connector is pulled out by mistake. The wires inside the cable may also become frayed and break, or the connector may fail. The far-end receiver is then no longer able to receive the signal sent from the near-end transmitter.

Unplug detectors are often included in signaling chips and other devices. These unplug detectors examine the signal levels on the cable lines and report when a failure is detected. However, such detectors may have significant delays in reporting cable breaks. These reporting delays are undesirable.

FIG. 1 shows a prior art unplug detector. A circuit on the transmitting side generates a signal SIG that is input to transmitter 10. Transmitter 10 drives one or more lines of cable 20 high and low to carry the signal to receiver 12. Receiver 12 detects the signal and amplifies or otherwise recovers the signal for use by far-end circuitry.

There may be periods of time when signaling stops or pauses. During these pauses when signal SIG is not active, a detect signal DET is driven out onto cable 20 by detect driver 14. Detect sensor 15 senses the voltage changes on cable 20 when detect driver 14 is driving the detect signal and generates an UNPLUG signal when the sensed voltages indicate that a break has occurred in cable 20.

FIG. 2 shows that cable unplug detection occurs when signaling is paused. Signal SIG is pulsed and varied to carry information from the transmitter to the receiver. During the time SIG is active, unplug detection does not occur. After a period of time, signal SIG stops pulsing and is idle. Perhaps no more information needs to be transmitted, or a timeout occurs, or the end of a frame is reached. During this pause in signaling, detect signal DET is activated, and detect driver 14 drives a detect signal onto cable 20. Detect sensor 15 then senses the voltage or voltage changes on cable 20 and activates unplug signal UNPLUG when conditions are met that indicate a cable break.

However, the cable break may have occurred much earlier, such as at time A. The unplug signal is not activated until time B, when detection occurs during the pause in signaling. Thus the communication system is not notified of the cable break until time B, even though the cable break occurred at time A.

The delay in detection may be significant. For example, the average delay or latency for detection may be 20 ms after the signal is paused. This long delay is undesirable, because the unplug detector can't detect the unplug event instantly. Hence, the system may fail to work because the unplug information is not obtained accurately.

What is desired is a cable unplug detector that does not have a long latency. A cable unplug detector that does not have to wait for signaling to pause is desirable to reduce latency. An unplug detection circuit is desired that performs detection while signaling is occurring is desirable. An in-situ unplug detector is desired.

BRIEF DESCRIPTION OF THE DRAWINGS

FIG. 1 shows a prior art unplug detector.
FIG. 2 shows that cable unplug detection occurs when signaling is paused.

DETAILED DESCRIPTION

The present invention relates to an improvement in cable unplug detectors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
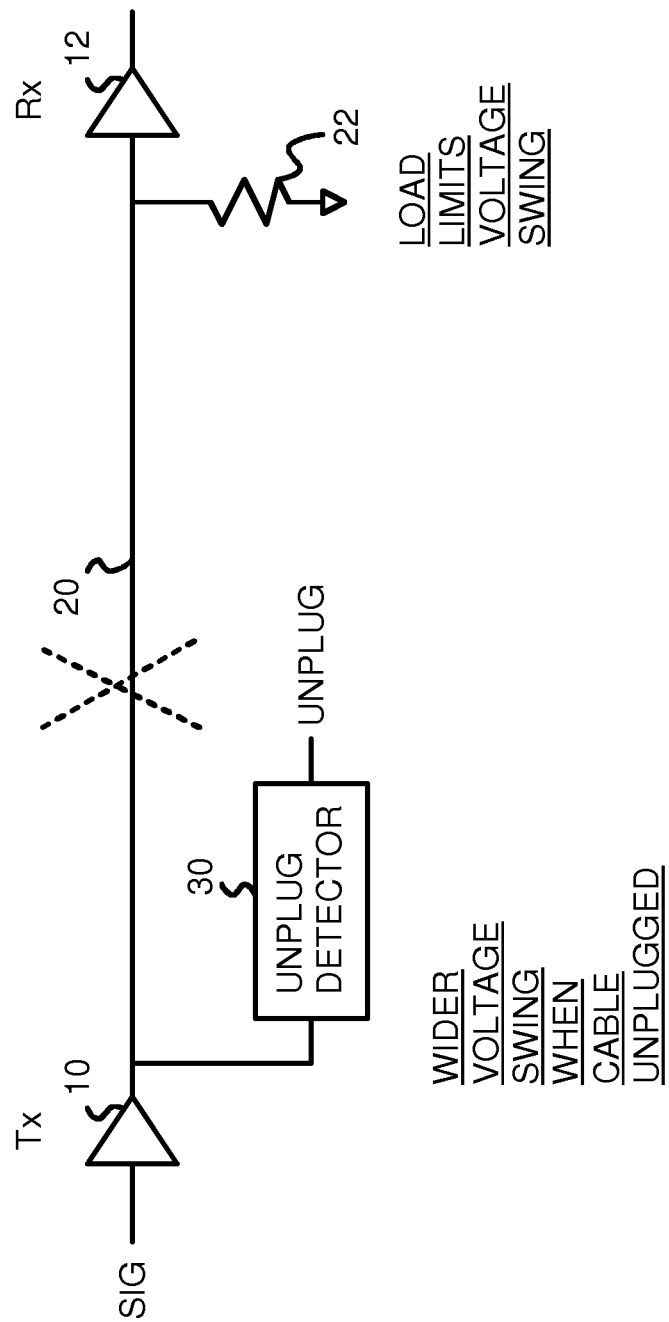
FIG. 3 is a block diagram of an in-situ unplug detector.

FIG. 3 is a block diagram of an in-situ unplug detector. Load resistor 22 on the far end of cable 20 and capacitive loading of the input of receiver 12, and of cable 20, limit the voltage swings of signal SIG that is driven onto cable 20 by transmitter 10. For example, cable 20 may be a foot or more in length. Load resistor 22 may significantly limit voltage swings, such as when load resistor 22 is a 50-Ohm termination resistor. Load resistor 22 is often added to limit voltage swings so that signaling speed may be increased, especially for differential signaling when cable 20 has a twisted pair of lines.

When cable 20 is disconnected or broken, transmitter 10 no longer drives load resistor 22. Thus the voltage swing on the output of transmitter 10 widens.

Unplug detector 30 examines the voltage swings on the output of transmitter 10. When the voltage swings increase, unplug detector 30 activates its UNPLUG signal.

The transmitting system can then react immediately, not waiting another 20 ms for the next pause in active signaling. For example, the transmitting system can retransmit the signal information over a different channel, such as a different cable or a different pair of wires in the same cable. The cable break may be detected in a short time, such as less than 1 ms, or even within 50 ns.

Figure 4:
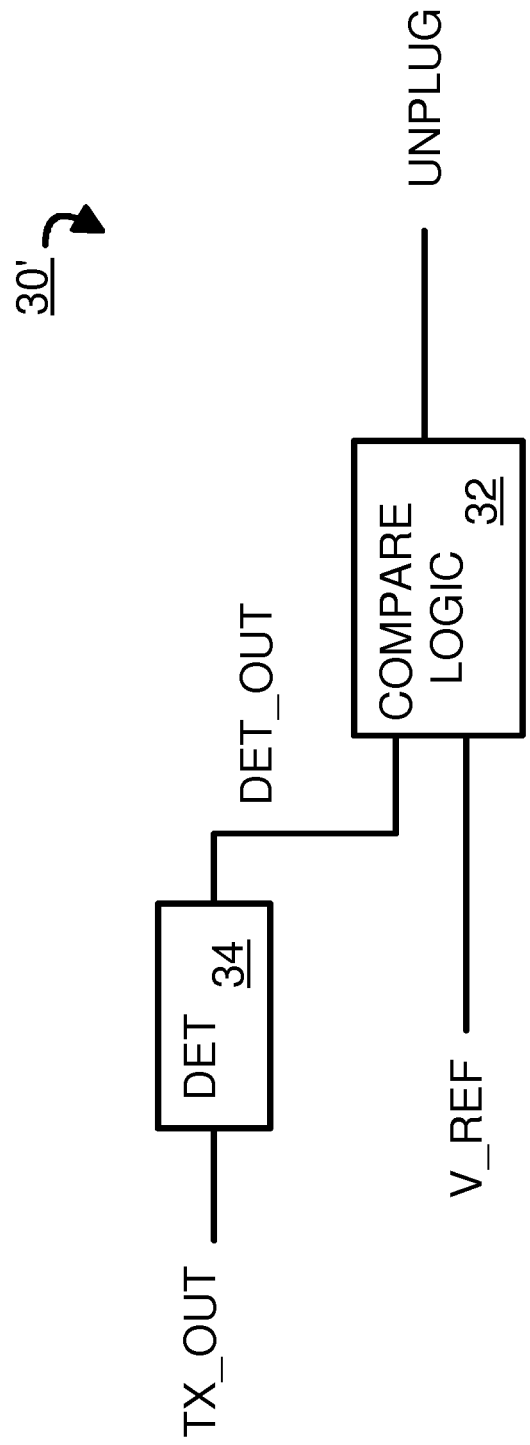
FIG. 4 shows a simple in-situ unplug detector.

FIG. 4 shows a simple in-situ unplug detector. Unplug detector 30' is connected to the output of transmitter 10 TX_OUT at the near-end of cable 20. Detector 34 is a peak detector, an envelop detector, or an energy detector. Hence, detect signal DET_OUT is tracked to the envelop of the differential signal TX_OUT.

For example, detector 34 may be a differential envelop detector which extracts the swing of TX_OUT. As an example, the detect signal DET_OUT doubles if the swing of TX_OUT doubles.

Compare logic 32 contains a voltage comparator that compares DET_OUT to a reference voltage V_REF. When the cable is connected, voltage swings at both the far-end and near-end of cable 20 are reduced, so TX_OUT and DET_OUT have a lower voltage that is less than V_REF. Then compare logic 32 does not activate UNPLUG.

When the cable is disconnected, voltage swings at the near-end of cable 20 are enlarged due to the loss of far-end loading, so TX_OUT has a greater signal swing. The absolute value of the voltage swings, DET_OUT, is larger and exceeds V_REF. Then compare logic 32 activates UNPLUG.

Figure 5:
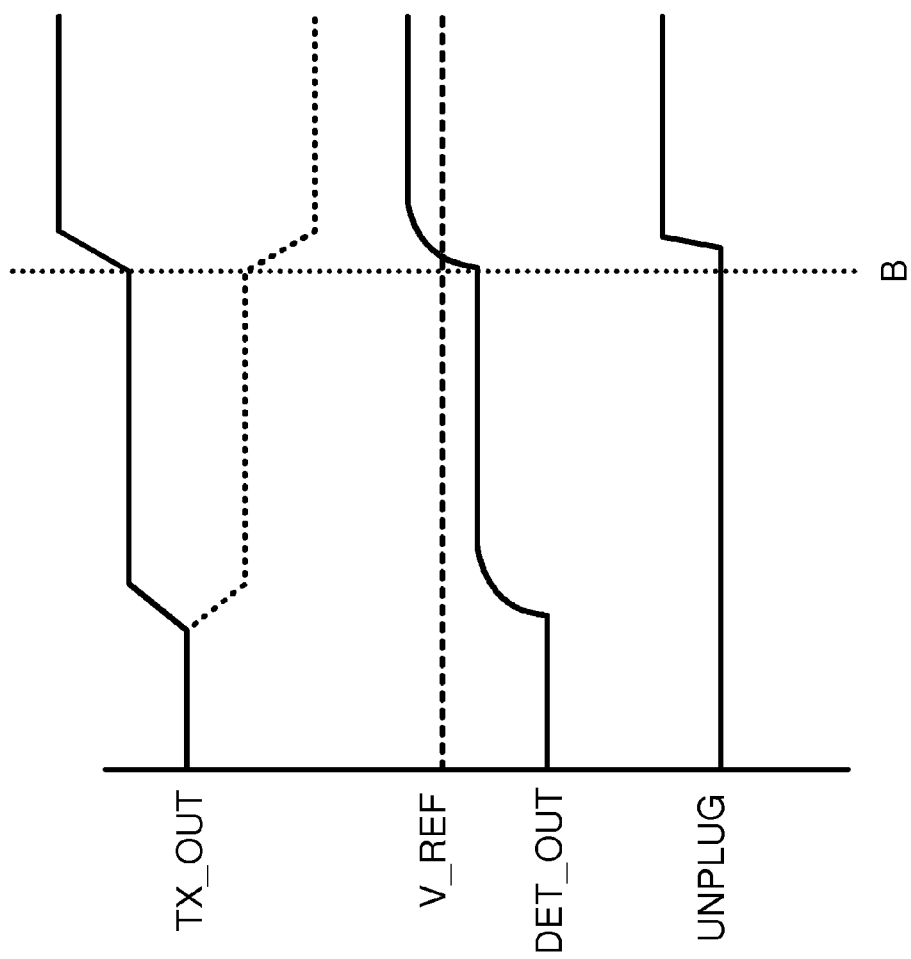
FIG. 5 is a waveform highlighting operation of the simple in-situ unplug detector of FIG. 4.

FIG. 5 is a waveform highlighting operation of the simple in-situ unplug detector of FIG. 4. A cable break occurs at time B. Before time B, the cable is connected properly and the near-end TX_OUT swings high (solid line) and low (dotted line). However, these high and low voltage swings are limited by far-end load resistor 22 and other far-end loading.

After the cable break occurs at time B, the loading including load resistor 22 is disconnected from the near-end signal TX_OUT. Since transmitter 10 drives with about the same force regardless of loading, the reduced loading of the disconnected near-end allows the TX_OUT voltage swing to reach higher absolute values.

Detector 34 detects or otherwise senses TX_OUT and generates its absolute swing value as DET_OUT, which is now higher due to the reduced loading after the cable break. DET_OUT amplifies this larger voltage swing and rises above V_REF. When DET_OUT is above V_REF, the compare logic activates UNPLUG, signaling to the system that the cable is unplugged or broken.

The value of reference voltage V_REF is selected so that DET_OUT is less than V_REF under normal conditions when cable 20 is connected, but DET_OUT is higher than V_REF when signaling occurs but the far-end load is missing. A circuit designer can simulate transmitter 10 under various loading conditions to select a value for V_REF or alter the circuitry inside the detector.

Figure 6:
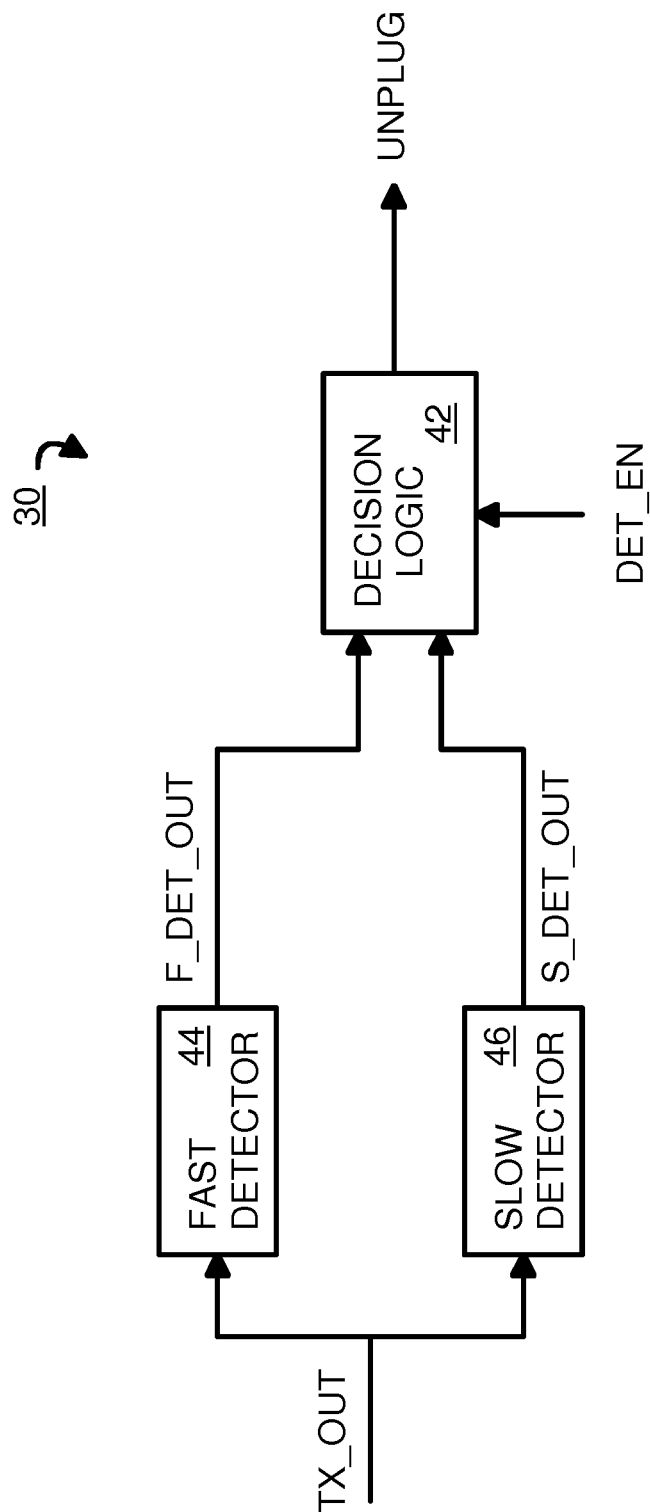
FIG. 6 shows an in-situ unplug detector.

FIG. 6 shows an in-situ unplug detector. In this alternative embodiment, slow detector 46 is use rather than a fixed reference voltage V_REF. In this embodiment, unplug detector 30 may be less sensitive to process, temperature, and design variations and thus may be more robust than unplug detector 30' of FIG. 4.

The near-end connector of cable 20, driven by transmitter 10, TX_OUT, is input to both fast detector 44 and to slow detector 46. Fast detector 44 has a higher bandwidth and faster response than does slow detector 46. For example, the response time of fast detector 44 can be 10 or more times faster than that of slow detector 46.

The output of fast detector 44, F_DET_OUT, is an absolute value of TX_OUT, so that larger absolute voltage swings of TX_OUT produce more positive signals of F_DET_OUT. Likewise, the output of slow detector 45, S_DET_OUT, is an absolute value of TX_OUT, but changes in S_DET_OUT occur with a greater delay than do changes in F_DET_OUT.

The fast and slow absolute detect signals, F_DET_OUT and S_DET_OUT, are applied as inputs to decision logic 42. When decision logic 42 is enabled by DET_EN, decision logic 42 activates UNPLUG when conditions for an unplugged cable are detected as explained in more detail in FIG. 7.

Figure 7:
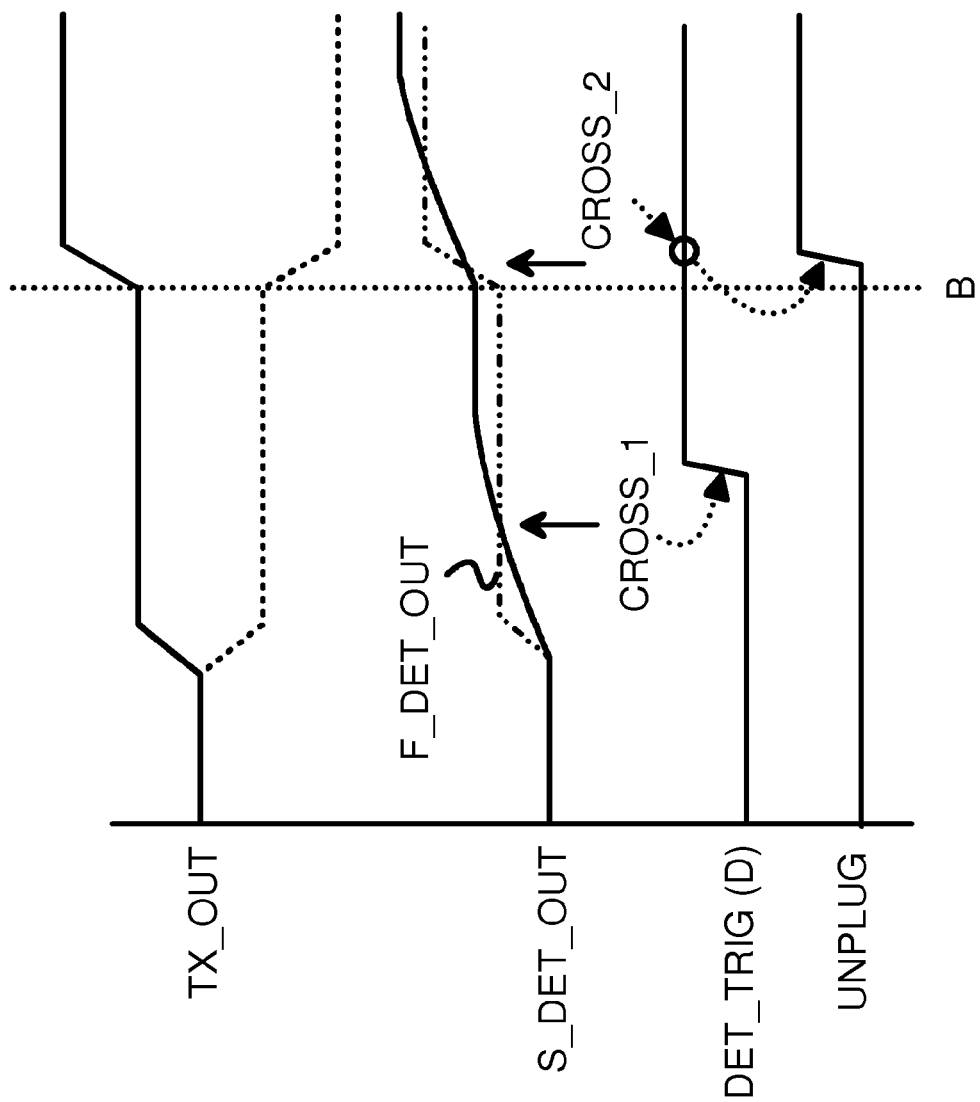
FIG. 7 is a waveform highlighting operation of the unplug detector of FIG. 6.

FIG. 7 is a waveform highlighting operation of the unplug detector of FIG. 6. A cable break occurs at time B. Before time B, the cable is connected properly and the near-end TX_OUT has positive swings (solid line) and negative swings (dotted line). However, these positive and negative voltage swings are limited by far-end load resistor 22 and other far-end loading before time B. After the cable break occurs at time B, loading is reduced and the receiver drives TX_OUT to a larger positive voltage and to a larger negative voltage as shown.

Before the break at time B, fast detector 44 rapidly tracks the absolute value of changes in TX_OUT to generate F_DET_OUT (dotted-dash line). Slow detector 46 also tracks the absolute value of voltage changes of TX_OUT to generate S_DET_OUT (solid line), but the slower operation of slow detector 46 causes S_DET_OUT to change more slowly than F_DET_OUT.

During normal operation before time B, F_DET_OUT rapidly reaches a maximum value and levels off while S_DET_OUT is still rising. Eventually, S_DET_OUT crosses above F_DET_OUT and CROSS_1 is detected by decision logic 42. Detect trigger D is activated when CROSS_1 occurs. Slow detector 46 is designed to generate a larger steady-state value of S_DET_OUT than is produced by fast detector 44 for F_DET_OUT so that first crossover CROSS_1 occurs during normal operation. UNPLUG remains inactive.

After the cable break occurs at time B, the loading including load resistor 22 is disconnected from the near-end signal TX_OUT. Since transmitter 10 drives with about the same force regardless of loading, the reduced loading of the disconnected near-end allows the voltage rise to higher absolute values after the break occurs at time B, as shown by the solid line, and also reaches a much lower low voltage after time B, as shown by the dotted line.

The larger values of TX_OUT after time B causes fast detector 44 to quickly raise F_DET_OUT above S_DET_OUT, which is slow to respond to the cable break. A second crossover of F_DET_OUT and S_DET_OUT occurs, CROSS_2. When CROSS_1 has already occurred, triggering DET_TRIG, and CROSS_2 occurs, then a valid unplug event has been detected. Decision logic 42 activates UNPLUG, driving UNPLUG high. Thus the system is notified soon after the break occurs at time B.

Figure 8:
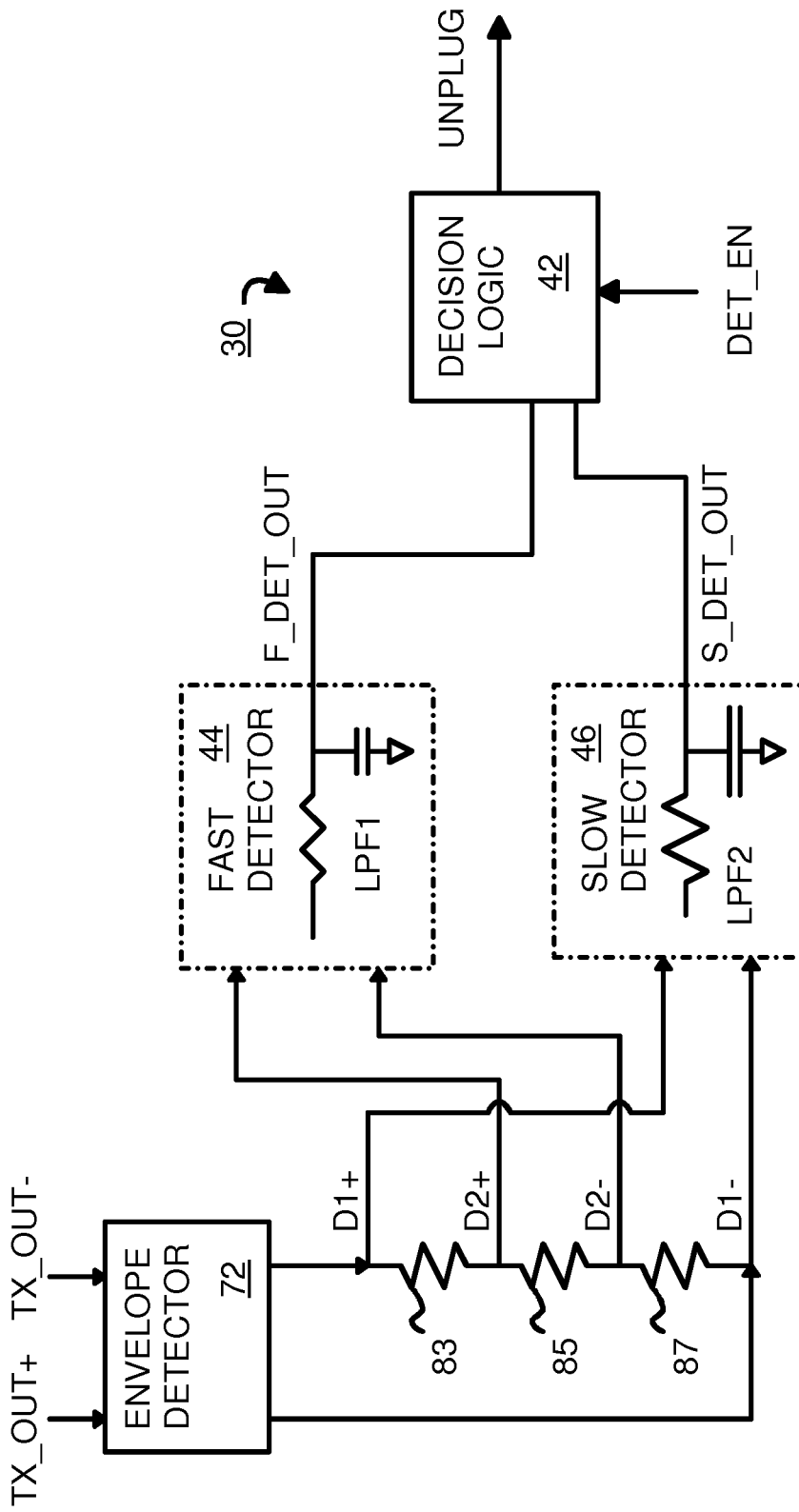
FIG. 8 is a schematic of an in-situ unplug detector.

FIG. 8 is a schematic of an in-situ unplug detector. envelop detector 72 extracts the amplitude of a differential input TX_OUT+, TX_OUT−. The output of envelop detector 72 is fed to a potential divider of resistors 83, 85, 87. The potential divider has two differential outputs. One output (D1+, D1−) is same as the output of envelop detector 72. The other output (D2+, D2−) is scaled to around 80%-90% of the full output swing of envelop detector 72. D2+, D2− is applied to low-pass filter LPF1 in fast detector 44, while D1+, D1− is applied to low-pass filter LPF2 in slow detector 46. LPF1 has a lower series resistance and lower capacitance than does LPF2 in slow detector 46, so that F_DET_OUT responds more quickly to changes in TX_OUT than does S_DET_OUT.

The steady-state value of F_DET_OUT is around 80%-90% of S_DET_OUT. After the cable break occurs, the load including load resistor 22 is disconnected from the near-end signal TX_OUT. Since the response time of F_DET_OUT is ten times or more than that of S_DET_OUT, fast detector 44 quickly raises F_DET_OUT above S_DET_OUT. The CROSS_2 event occurs, and a valid unplug event has been detected.

Decision logic 42 receives both F_DET_OUT and S_DET_OUT and contains logic to detect crossovers CROSS_1 and CROSS_2. CROSS_1 can enable a flip-flop or other logic so that when CROSS_2 occurs after CROSS_1, UNPLUG is activated. When another pulse of TX_OUT occurs, the flip-flop can be reset.

DET_EN can be used to disable decision logic 42, such as for a power savings mode. Another block (not shown) could be added between transmitter 10 and TX_OUT, to generate TX_OUT as an absolute value signal, simplifying decision logic 42.

ALTERNATE EMBODIMENTS

Several other embodiments are contemplated by the inventors. For example the detector could detect break using both rising and falling transitions of the near-end terminal, or just detect using the rising edge or just the falling edge. Buffers, inverters, gating logic, capacitors, resistors, or other elements may be added at various locations in the circuit for a variety of reasons unrelated to the invention, such as for power savings modes. The in-situ unplug detector could be added to only one wire in a cable or bundle, or could be added to many lines or to all lines in a cable.

Signals may be encoded, compressed, inverted, combined, or otherwise altered before transmission, and decoded, etc. after reception to recover the signal. Clocks may be combined with the signal and extracted at the receiver. A cable may carry a single signal line wire, or may have a pair of wires that carry a differential signal. Many pairs may be wound together in the same cable, and cables may be bundled together. The signal may be time multiplexed or divided to be sent over several pairs of wires in parallel. Cables may carry bi-directional signals, either by time-division multiplexing the same physical wires, or by having separate dedicated wires that carry signals in opposite directions.

Directional terms such as upper, lower, up, down, top, bottom, etc. are relative and changeable as the system or data is rotated, flipped over, etc. These terms are useful for describing the device but are not intended to be absolutes. Signals may be active high or active low, and may be inverted, buffered, encoded, qualified, or otherwise altered.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A circuit for detecting a disconnect condition for a cable coupled between a transmitter and a receiver, comprising:
    first circuitry configured to receive a transmitted signal transmitted on the cable by the transmitter, and to generate a first signal that is representative of the transmitted signal;
    second circuitry configured to receive the transmitted signal and to generate a second signal that is representative of the transmitted signal, wherein the second circuitry is configured to respond faster than the first circuitry to changes in the transmitted signal; and
    third circuitry configured to receive the first and second signals and to generate a third signal therefrom that is representative of the disconnect condition.

2. The circuit of claim 1, wherein the first circuitry is configured to generate the first signal with a first maximum amplitude, wherein the second circuitry is configured to generate the second signal with a second maximum amplitude, and wherein the first maximum amplitude is greater than the second maximum amplitude.

3. The circuit of claim 2, wherein the first and second circuitry include envelope detector circuitry configured to receive the transmitted signal and to generate first and second envelope signals therefrom, wherein the first circuitry further includes first detector circuitry configured to receive the first envelope signal and to generate the first signal therefrom, and wherein the second circuitry further includes second detector circuitry configured to receive the second envelope signal and to generate the second signal therefrom.

4. The circuit of claim 3, wherein the first detector circuitry includes a first low pass filter characterized by a first time constant, and the second detector circuitry includes a second low pass filter characterized by a second time constant, wherein the first time constant is greater than the second time constant.

5. The circuit of claim 2, wherein the third circuitry is configured to detect transitions when the first signal crosses the second signal, and to generate the third signal to indicate the disconnect condition in response to detection of a particular sequence of the transitions.

6. The circuit of claim 1, wherein the third circuitry is configured to detect a change in a load condition of the cable corresponding to the disconnect condition with reference to corresponding changes in the first and second signals.

7. The circuit of claim 1, wherein the third circuitry is configured to detect the disconnect condition with reference to one or both of a rising transition of the transmitted signal, or a falling transition of the transmitted signal.

8. A data transmission system, comprising:
a transmitter;
a receiver;
a cable for transmitting a data signal from the transmitter to the receiver; and
a disconnect detector for detecting a disconnect condition between the transmitter and the receiver, the disconnect detector including first circuitry configured to receive the data signal and to generate a first signal that is representative of the data signal, second circuitry configured to receive the data signal and to generate a second signal that is representative of the data signal, wherein the second circuitry is configured to respond faster than the first circuitry to changes in the data signal, the disconnect detector further comprising third circuitry configured to receive the first and second signals and to generate a third signal therefrom that is representative of the disconnect condition.

9. The data transmission system of claim 8, wherein the first circuitry is configured to generate the first signal with a first maximum amplitude, wherein the second circuitry is configured to generate the second signal with a second maximum amplitude, and wherein the first maximum amplitude is greater than the second maximum amplitude.

10. The data transmission system of claim 9, wherein the first and second circuitry include envelope detector circuitry configured to receive the data signal and to generate first and second envelope signals therefrom, wherein the first circuitry further includes first detector circuitry configured to receive the first envelope signal and to generate the first signal therefrom, and wherein the second circuitry further includes second detector circuitry configured to receive the second envelope signal and to generate the second signal therefrom.

11. The data transmission system of claim 10, wherein the first detector circuitry includes a first low pass filter characterized by a first time constant, and the second detector circuitry includes a second low pass filter characterized by a second time constant, wherein the first time constant is greater than the second time constant.

12. The data transmission system of claim 9, wherein the third circuitry is configured to detect transitions when the first signal crosses the second signal, and to generate the third signal to indicate the disconnect condition in response to detection of a particular sequence of the transitions.

13. The data transmission system of claim 8, wherein the third circuitry is configured to detect a change in a load condition of the cable corresponding to the disconnect condition with reference to corresponding changes in the first and second signals.

14. The data transmission system of claim 8, wherein the third circuitry is configured to detect the disconnect condition with reference to one or both of a rising transition of the data signal, or a falling transition of the data signal.

15. The data transmission system of claim 8, wherein the transmitter is configured to retransmit the data signal on a different channel in response to the disconnect condition.

16. The data transmission system of claim 15, wherein the different channel comprises one or more different conductors in the cable, or a different cable.

17. A method for detecting a disconnect condition for a cable coupled between a transmitter and a receiver, comprising:
receiving a transmitted signal transmitted on the cable by the transmitter;
generating a first signal that is representative of the transmitted signal;
generating a second signal that is representative of the transmitted signal, wherein the second signal respond fasters than the first signal to changes in the transmitted signal; and
generating a third signal from the first and second signals that is representative of the disconnect condition.

18. The method of claim 17, wherein generating the third signal comprises detecting transitions when the first signal crosses the second signal, and generating the third signal to indicate the disconnect condition in response to detection of a particular sequence of the transitions.

19. The method of claim 17, wherein generating the third signal comprises detecting a change in a load condition of the cable corresponding to the disconnect condition with reference to corresponding changes in the first and second signals.

20. The method of claim 17, wherein generating the third signal comprises detecting the disconnect condition with reference to one or both of a rising transition of the transmitted signal, or a falling transition of the transmitted signal.

* * * * *